(12) United States Patent
Greeley et al.

(10) Patent No.: US 9,236,427 B2
(45) Date of Patent: Jan. 12, 2016

(54) MULTI-MATERIAL STRUCTURES AND CAPACITOR-CONTAINING SEMICONDUCTOR CONSTRUCTIONS

(71) Applicant: Micron Technology, Inc., Boise, ID (US)

(72) Inventors: Joseph Neil Greeley, Boise, ID (US); Duane M. Goodner, Boise, ID (US); Vishwanath Bhat, Boise, ID (US); Vassil N. Antonov, Boise, ID (US); Prashant Raghu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/501,423

(22) Filed: Sep. 30, 2014

(65) Prior Publication Data
US 2015/0054127 A1    Feb. 26, 2015

Related U.S. Application Data

(62) Division of application No. 13/546,927, filed on Jul. 11, 2012, now Pat. No. 8,865,544.

(51) Int. Cl.
*H01L 27/108* (2006.01)
*H01L 29/94* (2006.01)
*H01L 49/02* (2006.01)
*B82Y 30/00* (2011.01)

(52) U.S. Cl.
CPC ............... *H01L 28/75* (2013.01); *H01L 28/65* (2013.01); *H01L 28/90* (2013.01); *B82Y 30/00* (2013.01); *H01L 27/10808* (2013.01); *H01L 27/10852* (2013.01); *Y10S 977/932* (2013.01)

(58) Field of Classification Search
None
See application file for complete search history.

(56) References Cited

U.S. PATENT DOCUMENTS

| | | | |
|---|---|---|---|
| 6,846,749 B1 | 1/2005 | Gabriel et al. | |
| 7,226,845 B2 | 6/2007 | Manning et al. | |
| 7,271,051 B2 | 9/2007 | Manning et al. | |
| 7,713,813 B2 | 5/2010 | Raghu | |
| 8,138,577 B2 | 3/2012 | Shi et al. | |
| 8,148,728 B2 | 4/2012 | Or-Bach et al. | |
| 8,193,615 B2 | 6/2012 | Haba et al. | |
| 2003/0153146 A1 | 8/2003 | Won et al. | |
| 2006/0040444 A1* | 2/2006 | Lee et al. | 438/238 |
| 2006/0086952 A1 | 4/2006 | Kim et al. | |
| 2006/0278979 A1 | 12/2006 | Rangel | |
| 2007/0117333 A1 | 5/2007 | Yoon et al. | |
| 2009/0291524 A1 | 11/2009 | Takahashi | |
| 2010/0176365 A1* | 7/2010 | Park et al. | 257/3 |

* cited by examiner

*Primary Examiner* — Evan Pert
*Assistant Examiner* — Shaka White
(74) *Attorney, Agent, or Firm* — Wells St. John P.S.

(57) ABSTRACT

Some embodiments include a method of forming a capacitor. An opening is formed through a silicon-containing mass to a base, and sidewalls of the opening are lined with protective material. A first capacitor electrode is formed within the opening and has sidewalls along the protective material. At least some of the silicon-containing mass is removed with an etch. The protective material protects the first capacitor electrode from being removed by the etch. A second capacitor electrode is formed along the sidewalls of the first capacitor electrode, and is spaced from the first capacitor electrode by capacitor dielectric. Some embodiments include multi-material structures having one or more of aluminum nitride, molybdenum nitride, niobium nitride, niobium oxide, silicon dioxide, tantalum nitride and tantalum oxide. Some embodiments include semiconductor constructions.

15 Claims, 12 Drawing Sheets

MULTI-MATERIAL STRUCTURES AND CAPACITOR-CONTAINING SEMICONDUCTOR CONSTRUCTIONS

RELATED PATENT DATA

This patent resulted from a divisional of U.S. patent application Ser. No. 13/546,927, which was filed Jul. 11, 2012, which issued as U.S. Pat. No. 8,865,544, and which is hereby incorporated herein by reference.

TECHNICAL FIELD

Multi-material structures, semiconductor constructions and methods of forming capacitors.

BACKGROUND

Capacitors continue to have increasing aspect ratios in higher generation integrated circuitry fabrication. For example, dynamic random access memory (DRAM) capacitors may have elevations of from about 2 to about 3 microns, and widths of about 0.1 micron. Further, it is a continuing goal to increase the density of semiconductor devices, with a corresponding goal to reduce the footprint associated with individual devices.

It can be difficult to fabricate and utilize the tall, thin capacitors of high-density integrated circuitry in that such capacitors may be structurally weak and subject to toppling or breaking from an underlying base. Accordingly, lattices have been developed to support capacitor electrodes. However, difficulties continue to be encountered as capacitor electrodes become increasingly more tightly packed. An example difficulty is described with reference to FIGS. 1-3.

FIG. 1 shows a semiconductor construction 10 comprising a base 12. The base comprises a semiconductor substrate 11 supporting a pair of electrodes 14 and 16. Container-shaped capacitor storage node structures 18 and 20 are supported over the electrodes, with such storage node structures comprising electrically conductive material 22. The storage node structures are formed within openings that extend through a sacrificial material 24. A lattice structure 26, comprising electrically insulative material 28, is adjacent the storage nodes. The lattice structure will provide support to the storage nodes after the sacrificial material 24 is removed.

FIG. 2 shows a desired configuration resulting from removal of sacrificial material 24 (FIG. 1), and FIG. 3 shows a problematic configuration that can occur instead of the desired configuration. Specifically, in some applications segments of adjacent storage nodes may be drawn together during the removal of sacrificial material 24 (FIG. 1) to cause a short 30 between the adjacent storage nodes. One mechanism by which the adjacent segments may be drawn together to form short 30 is the generation of capillary forces between the adjacent segments during wet etching of the sacrificial material 24 (FIG. 1).

It is desired to develop new methods of fabricating capacitors which alleviate or prevent the problem shown in FIG. 3. It is further desired for such methods to be suitable for other applications besides fabrication of the particular capacitor storage nodes of FIGS. 1-3. It is also desired to develop new structures, such as capacitor constructions, through such methods.

DETAILED DESCRIPTION OF THE ILLUSTRATED EMBODIMENTS

In some embodiments, liners are provided along surfaces of capacitor electrodes to protect such electrodes during a subsequent etch (for instance, a vapor etch) of sacrificial material adjacent the electrodes. In some embodiments, new capacitor structures may comprise the liners. In some embodiments, liners may be electrically conductive and be incorporated into capacitor electrodes. In some embodiments, the liners may be electrically insulative and be incorporated into capacitor dielectric. In some embodiments, new integrated structures other than capacitors may comprise liner compositions in combination with other electrically conductive compositions.

Example embodiments are described with reference to FIGS. 4-24.

Figure 1:
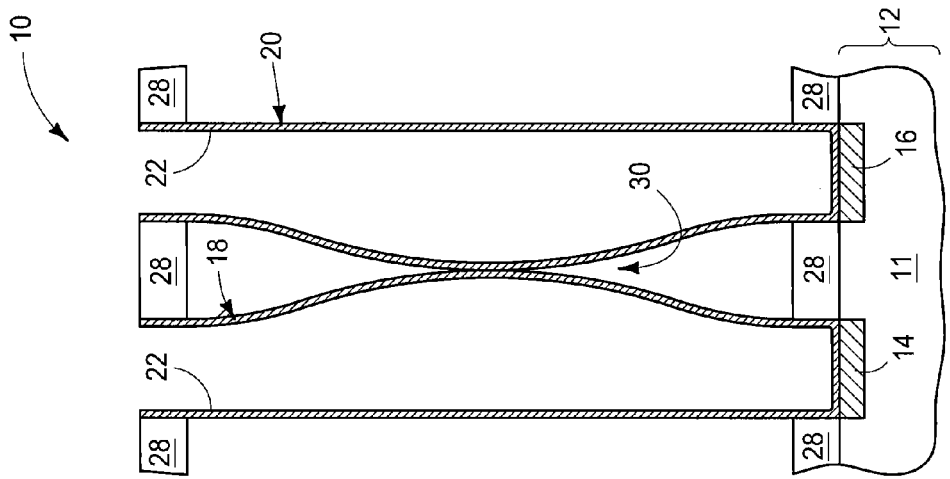
FIG. 1 is a diagrammatic cross-sectional view of a portion of a semiconductor construction at a process stage of a prior art process.
Figure 4:
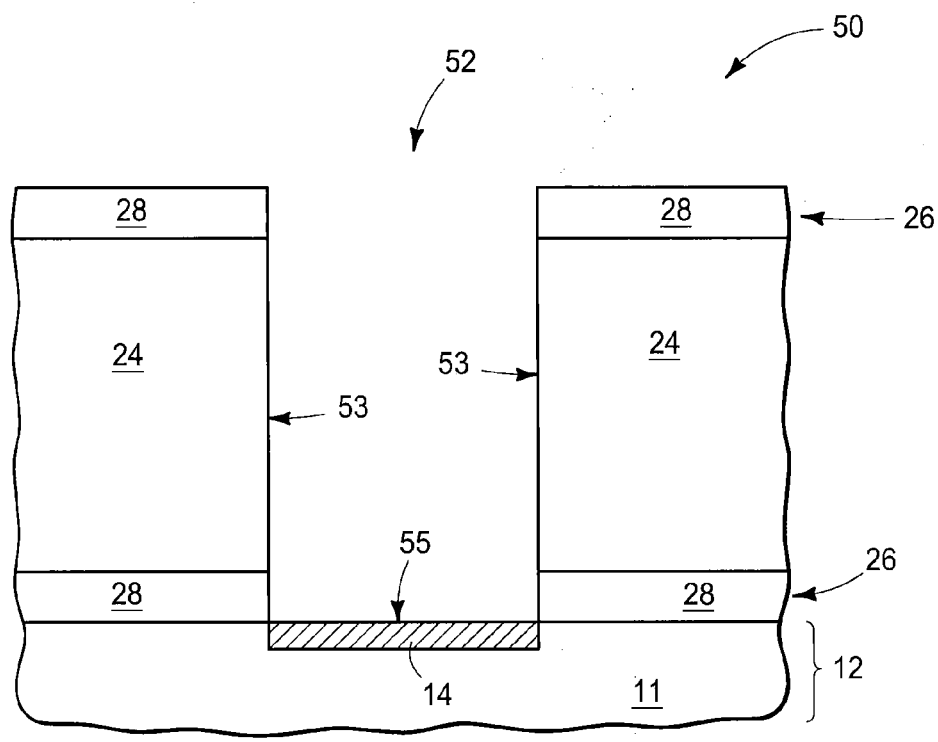
FIGS. 4-10 are diagrammatic cross-sectional views of a portion of a semiconductor construction shown at various process stages of an example embodiment method of forming a capacitor construction.

Referring to FIG. 4, a semiconductor construction 50 is shown to comprise various structures analogous to those described above with reference to the prior art construction of FIG. 1. Specifically, construction 50 comprises the base 12 containing the semiconductor substrate 11 supporting the electrode 14, the lattice structure 26 comprising material 28, and the sacrificial material 24. An opening 52 extends through the sacrificial material 24 and lattice structure 26 to expose an upper surface of node 14. The construction 50 is shown at a different scale than FIG. 1 to simplify the drawings that follow. The construction 50 may have tall thin openings with high aspect ratios, such as those described in the "Background" of this disclosure.

Substrate 11 may comprise monocrystalline silicon. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although substrate 11 is shown to be homogenous, the substrate may comprise numerous materials in some embodiments. For instance, substrate 11 may contain one or more materials associated with integrated circuit fabrication. In such embodiments, such materials may correspond to one or more of refractory metal materials, barrier materials, diffusion materials, insulator materials, etc. In the shown embodiment, substrate 11 may comprise an electrically insulative material (for instance, silicon nitride or silicon dioxide) over a semiconductor material, and the node 14 may be laterally surrounded by the electrically insulative material.

Node 14 may comprise any suitable electrically conductive composition or combination of compositions. In some embodiments, the node may comprise a conductively-doped semiconductor material corresponding to a source/drain region of a transistor. In such embodiments, the node may also comprise a layer of silicide over the conductively-doped region.

The lattice material 28 may comprise an electrically insulative material; and in some embodiments may comprise, consist essentially of or consist of silicon nitride.

Sacrificial material 24 may comprise silicon, and in some embodiments may be referred to as a silicon-containing mass. In some embodiments, the sacrificial material 24 may comprise, consist essentially of or consist of one or both of polycrystalline silicon and amorphous silicon, and may be doped or undoped. The illustrated lattice structure comprises two levels, with a lower-level being along base 12 and with an upper level above material 24. In other embodiments, a lattice structure may comprise more than the two shown levels, or may comprise only a single level. In some embodiments, the lattice structure may be omitted.

The opening 52 may be formed with any suitable processing. For instance, a patterned mask (not shown) may be used to define a location of the opening, and then the opening may be extended through materials 24 and 28 utilizing one or more suitable etches. In subsequent processing, the mask may be removed to leave the construction shown in FIG. 4. The mask may be a photolithographically-patterned mask, or any other suitable mask; including, for example, a mask formed utilizing pitch-multiplication methodologies.

The opening 52 may have any suitable dimensions, and in some embodiments may have an aspect ratio of at least about 20:1, at least about 30:1, at least about 40:1, etc. For instance, the opening may have a height of several microns, and a width of less than or equal to about one-tenth of a micron.

The opening 52 has a periphery comprising sidewalls 53 and a bottom 55. The opening may have any suitable shape when viewed from above; including, for example, a circular shape, elliptical shape, polygonal shape, etc. The sidewalls 53 may thus be part of a continuous lateral periphery of the opening.

Figure 5:
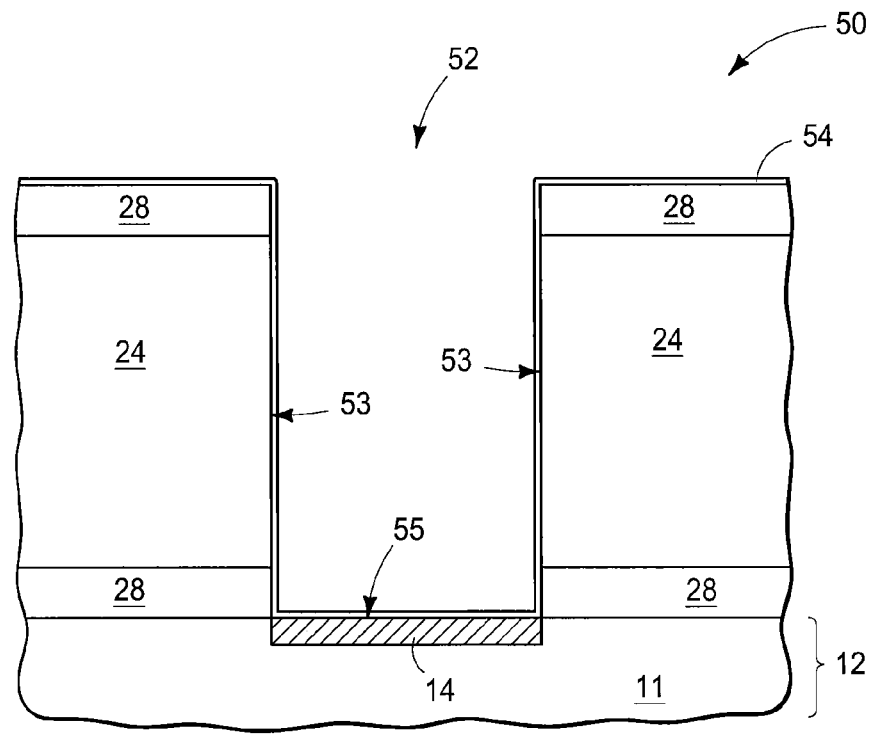

Referring to FIG. 5, a material 54 is deposited within opening 52. Such material lines sidewalls 53 and bottom 55 of the opening. The material 54 may be referred to as a protective material, in that such material may ultimately protect a capacitor electrode during etching of sacrificial material 24. The protective material 54 may comprise any suitable composition or combination of compositions; and in some embodiments may comprise, consist essentially of, or consist of one or more of aluminum nitride, molybdenum nitride, niobium nitride, niobium oxide, silicon dioxide, tantalum nitride and tantalum oxide. The protective material may be electrically conductive in some embodiments, and may be electrically insulative in other embodiments.

The protective material 54 may be deposited with any suitable processing; including, for example, one or more of atomic layer deposition (ALD), chemical vapor deposition (CVD), and physical vapor deposition (PVD).

The protective material may be formed to any suitable thickness, and in some embodiments may be kept very thin. For instance, the protective material may be formed to a thickness within a range of from about a single monolayer to about 1.5 nanometers.

Although the protective material 54 is shown to comprise a single homogeneous composition in the embodiment of FIG. 5, in other embodiments (for instance, embodiments described below with reference to FIGS. 13-17) the protective material may comprise two or more discrete compositions.

Figure 6:
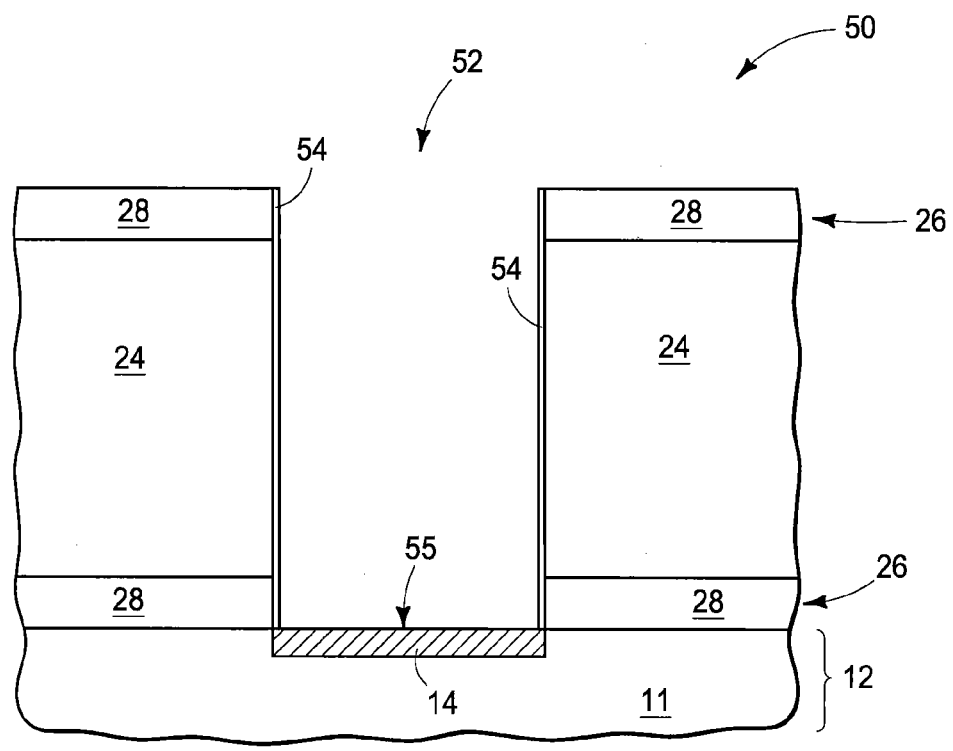

Referring to FIG. 6, the protective material 52 is removed from the bottom 55 of opening 52 with an anisotropic etch. Such etch also removes material 52 from over an upper surface of construction 50.

Figure 7:
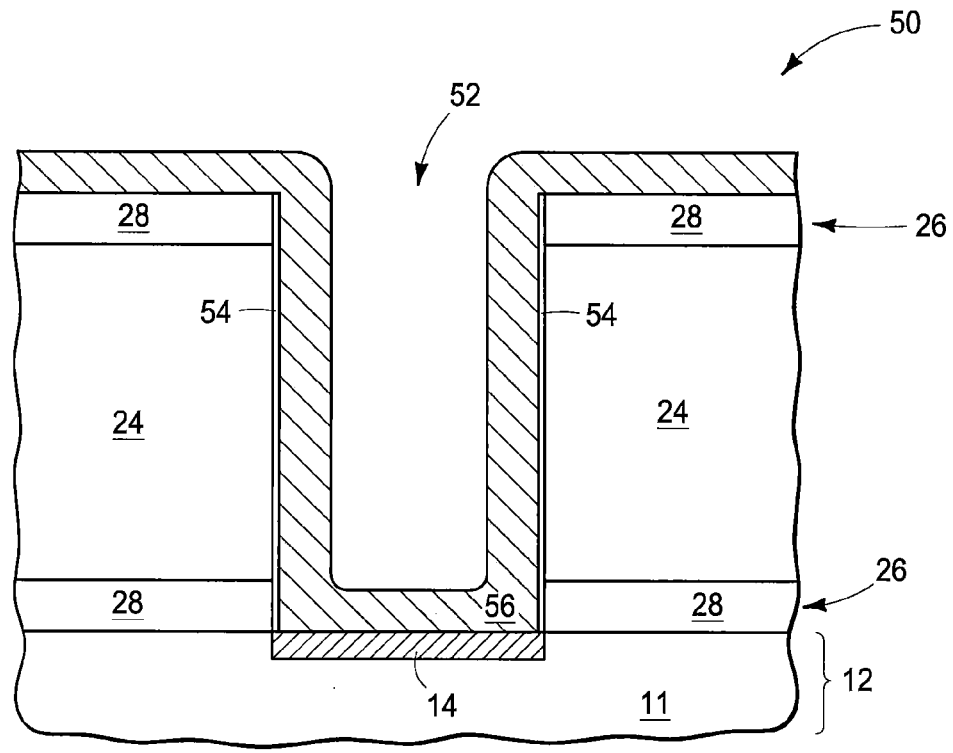

Referring to FIG. 7, capacitor electrode material 56 is formed within opening 52 and along the sidewall liners of protective material 54. The capacitor electrode material 56 is formed directly against an upper surface of node 14 in the shown embodiment.

The capacitor electrode material 56 may comprise any suitable composition or combination of compositions; and in some embodiments may comprise, consist essentially of, or consist of one or both of titanium nitride and ruthenium.

The capacitor electrode material 56 may be formed with any suitable methodology, including, for example, one or more of ALD, CVD and PVD. The capacitor electrode material 56 may be formed to any suitable thickness, and in some embodiments may be formed to a thickness of less than or equal to about 50 nanometers; such as, for example, a thickness within a range of from about 3 nanometers to about 10 nanometers.

Figure 8:
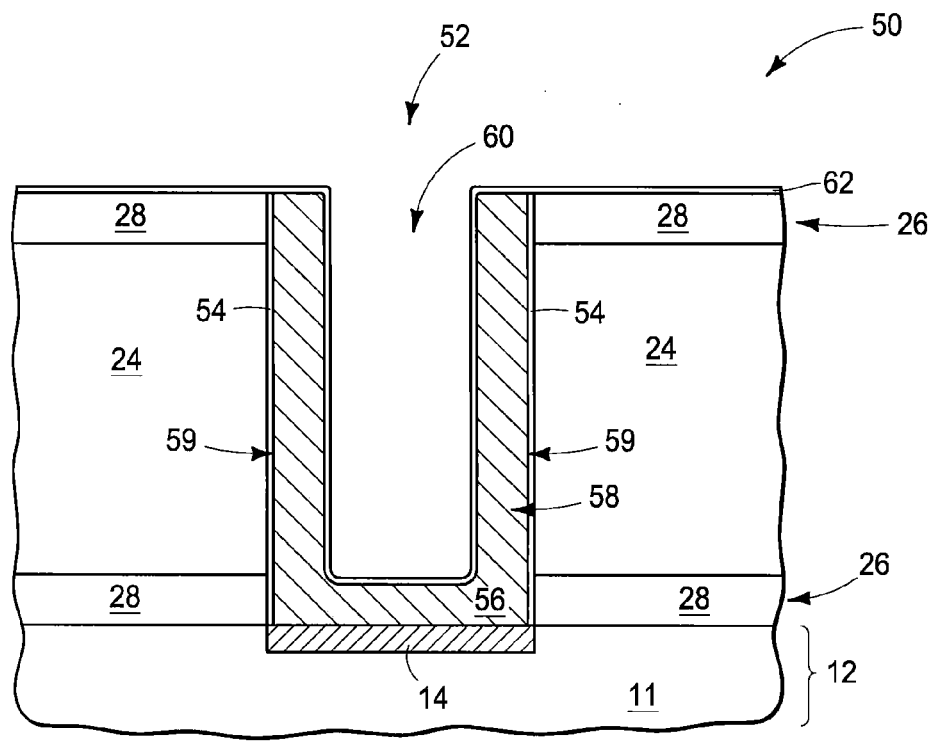

Referring to FIG. 8, the capacitor electrode material 56 is removed from over an upper surface of construction 10 to pattern the capacitor electrode material into a capacitor electrode (specifically, a storage node electrode) 58. Such storage node electrode has sidewalls 59 along the protective material 54. The capacitor electrode material 56 may be removed from over the upper surface of construction 50 with any suitable processing, including, for example, chemical-mechanical polishing (CMP). If CMP is utilized, a fill material (not shown) may be provided within opening 52 during the CMP, and then removed.

The storage node electrode 58 is a container-shaped electrode in the shown embodiment. In other embodiments, the storage node electrode may have other configurations, such as, for example, pillar configurations.

In the shown embodiment, the container-shaped electrode 58 defines a container 60. A material 62 is formed within such container. The material 62 is a protective material similar to material 54. The material 62 may comprise any of the compositions described above with reference to protective material 54, and may comprise a thickness within a range of from about a single monolayer to about 1.5 nanometers in some embodiments.

The materials 54 and 62 may be referred to as first and second protective materials, respectively, to distinguish such materials from one another. In some embodiments, the first and second protective materials may comprise a same composition as one another; and in other embodiments the first and second protective materials may comprise different compositions from one another.

Figure 9:
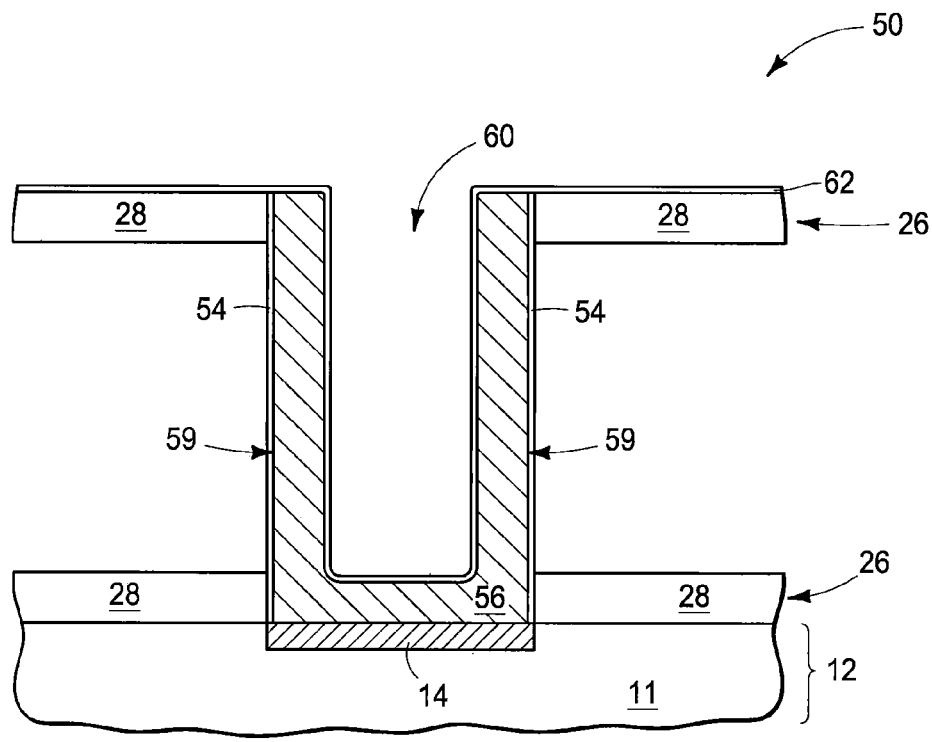

Referring to FIG. 9, sacrificial material 24 (FIG. 8) is removed. In embodiments in which the sacrificial material is a silicon-containing mass, such removal may be conducted utilizing a vapor etch. An example vapor etch may utilize $F_2$ gas in combination with $NH_3$ gas. Another example vapor etch may utilize $NF_3$ together with plasma. The removal may be additionally, or alternatively, conducted utilizing wet etching with, for example, ammonium hydroxide, tetramethyl ammonium hydroxide (TMAH), etc.

Figure 3:
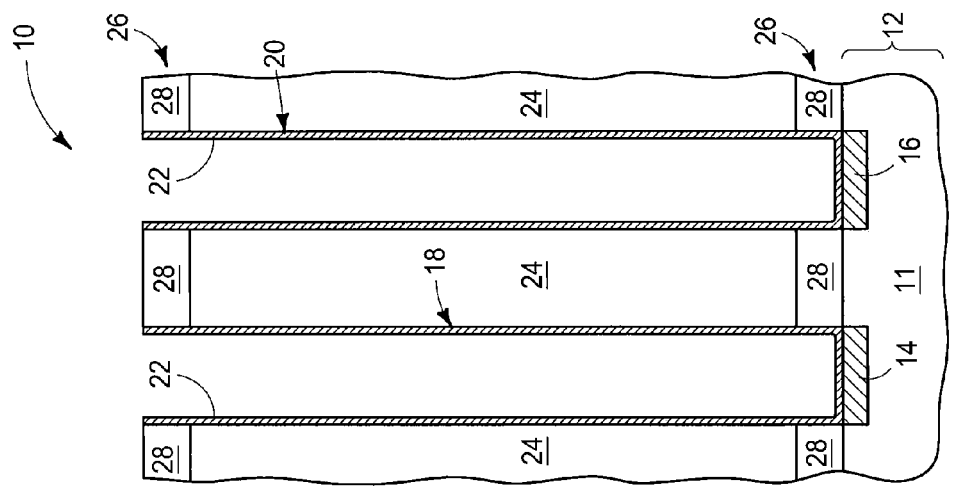
FIG. 3 is a view of the construction shown at the process stage of FIG. 2 and having a problematic prior art configuration.
Figure 2:
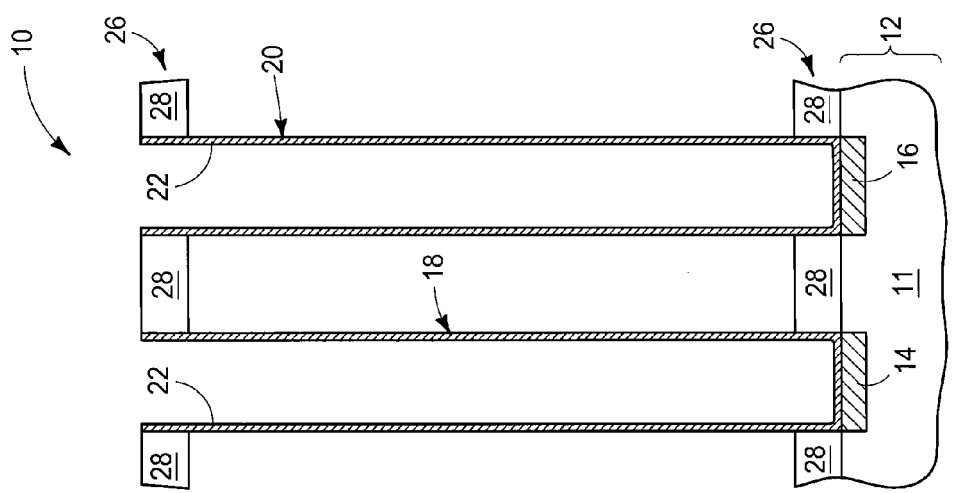
FIG. 2 is a view of the construction of FIG. 1 shown at a process stage subsequent to that of FIG. 1 and having a desired prior art configuration.

Vapor etching may eliminate the problematic capillary forces that led to the problem discussed above with reference to FIG. 3. However, the vapor etching may be substantially non-selective for sacrificial material 24 (FIG. 8) relative to the capacitor electrode material 56. Accordingly, the protective materials 54 and 62 may be provided to protect the capacitor electrode material 56 during the vapor etching. In some embodiments, the vapor etching may be about 100 percent selective for sacrificial material 24 relative to protective materials 54 and 62 utilizing the vapor etch chemistries described above in combination with the compositions of materials 24, 54 and 62 described above. In addition to protecting against vapor etching, the protective material(s) may also protect against other dry or wet etch chemistries that may be used in addition to, or alternatively to, vapor etching for removing the sacrificial material 24 (i.e., sacrificial mold material). The protective material(s) may also protect underlying materials against chemistries used for processing steps other than sacrificial mold removal (for instance, wet cleans that may be used for processing steps after bottom electrode deposition and prior to polysilicon mold removal).

In the shown embodiment, an entirety of material 24 (FIG. 8) is removed with the etch. In other embodiments, only some of material 24 may be removed.

Figure 10:
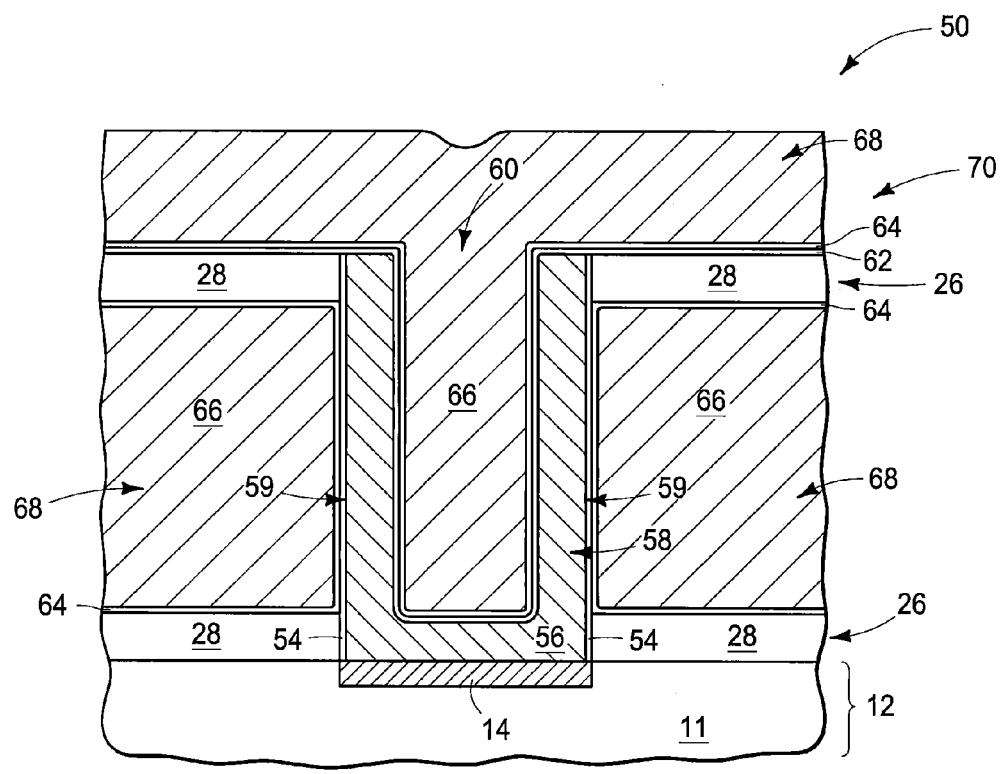

Referring to FIG. 10, capacitor dielectric material 64 is formed within the container-shaped storage electrode 58, and along the protective material 54 along the outer sidewalls 59 of the storage node electrode. The capacitor dielectric material may comprise any suitable composition or combination of compositions; and in some embodiments may comprise, consist essentially of, or consist of one or more of hafnium oxide, silicon dioxide, silicon nitride, zirconium oxide, etc. In the shown embodiment, the capacitor dielectric material is formed directly against protective materials 54 and 62.

A capacitor electrode material 66 is formed along the dielectric material 64. The capacitor electrode material 66 may comprise any suitable electrically conductive composition or combination of compositions; including, for example, any of various metals (for instance, titanium, tungsten, ruthenium, etc.), metal-containing compositions (for instance, metal silicides, metal nitrides, etc.) and conductively-doped semiconductor materials (for instance, conductively-doped silicon, conductively-doped germanium, etc.). In some embodiments, the capacitor electrode materials 56 and 66 may be referred to as first and second capacitor electrode materials, respectively. The capacitor electrode material 66 may comprise a same composition as capacitor electrode material 56 in some embodiments, and may comprise a different composition from capacitor electrode material 56 in other embodiments.

The capacitor electrode material 66 forms a capacitor electrode 68. The capacitor electrode 68 may be referred to as a plate electrode. In some embodiments, the capacitor electrodes 58 and 68 may be referred to as first and second capacitor electrodes, respectively.

The electrodes 58 and 68, together with the capacitive dielectric between such electrodes, form a capacitor 70. The capacitor may be representative of a large number of capacitors simultaneously formed across a memory array region of a semiconductor substrate during fabrication of a DRAM array.

The protective materials 54 and 62 may comprise dielectric materials, and may be considered to form part of the capacitor dielectric in some embodiments. In other embodiments, the protective material 54 may comprise electrically conductive material, and may be considered to form part of the storage node electrode. The protective material 62 would typically not comprise electrically conductive material in the shown embodiment, in that the protective material 62 could short adjacent storage nodes to one another. However, in other embodiments the protective material 62 may be removed from over the top of the lattice material 28, and in such embodiments the protective material 62 may comprise electrically conductive material.

In some embodiments in which protective materials 54 and 62 are dielectric materials, the protective materials may be utilized as the sole dielectric of a capacitor rather than being utilized in combination with the additional dielectric material 64—if materials 54 and 62 are of appropriate composition and thickness.

The embodiment of FIG. 10 may be distinguished from prior art capacitors in that the embodiment comprises the protective material 54 along sidewalls 59 of the capacitor storage node 58, and comprises the protective material 54 between lattice material 28 and storage node electrode 58. In some embodiments, the capacitor FIG. 10 may be described as comprising a first material (corresponding to conductive protective material 54) between the capacitor storage node 58 and the plate electrode 68, and further as comprising the first material between the capacitor storage node and the lattice material 28.

The embodiment of FIG. 10 has protective material 54 removed from over the top of node 14 prior to forming capacitor electrode material 56, and thus the capacitor electrode material directly contacts node 14. In other embodiments, the protective material may remain over the upper surface of node 14, and may remain in a finished capacitor construction between electrode 58 and node 14. An example of such other embodiments is described with reference to FIGS. 11 and 12.

Figure 11:
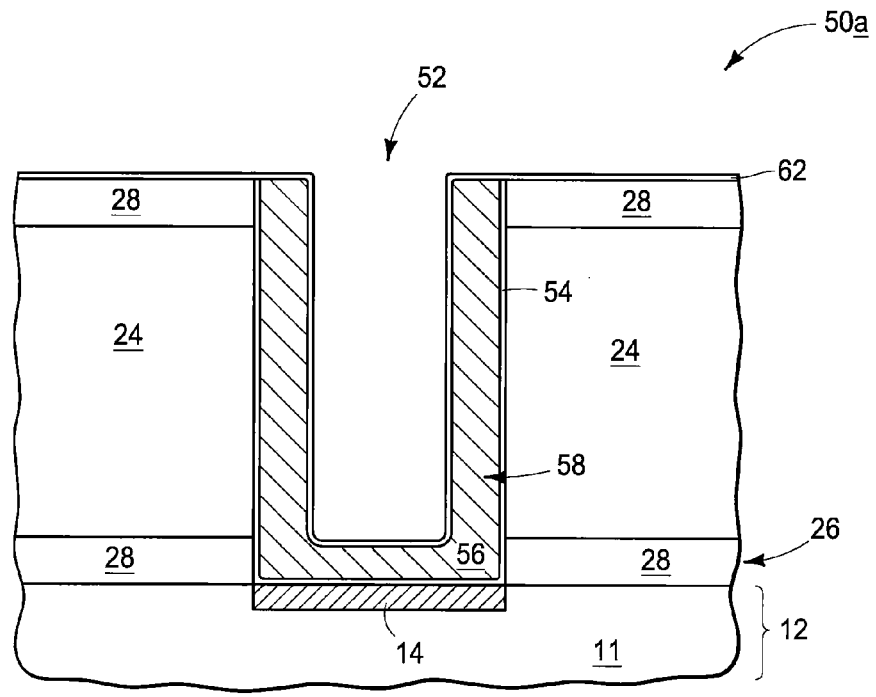
FIGS. 11 and 12 are diagrammatic cross-sectional views of a portion of a semiconductor construction shown at various process stages of another example embodiment method of forming a capacitor construction. The process stage of FIG. 11 may follow that of FIG. 5 in some embodiments.

Referring to FIG. 11, a construction 50a is shown at a processing stage analogous to that of FIG. 8. However, material 54 remains along the bottom of opening 52, rather than having been removed with a punch-through etch of the type described above with reference to FIG. 6. Accordingly, material 54 is between electrical node 14 and the capacitor electrode 58. In some embodiments, material 54 is electrically conductive and accordingly maintains ohmic coupling between node 14 and electrode 58. In other embodiments, material 54 may be a dielectric material. However, the material may be thin enough so that adequate electrical coupling between node 14 and electrode 58 is maintained in spite of the presence of the dielectric material 54 between them.

Figure 12:
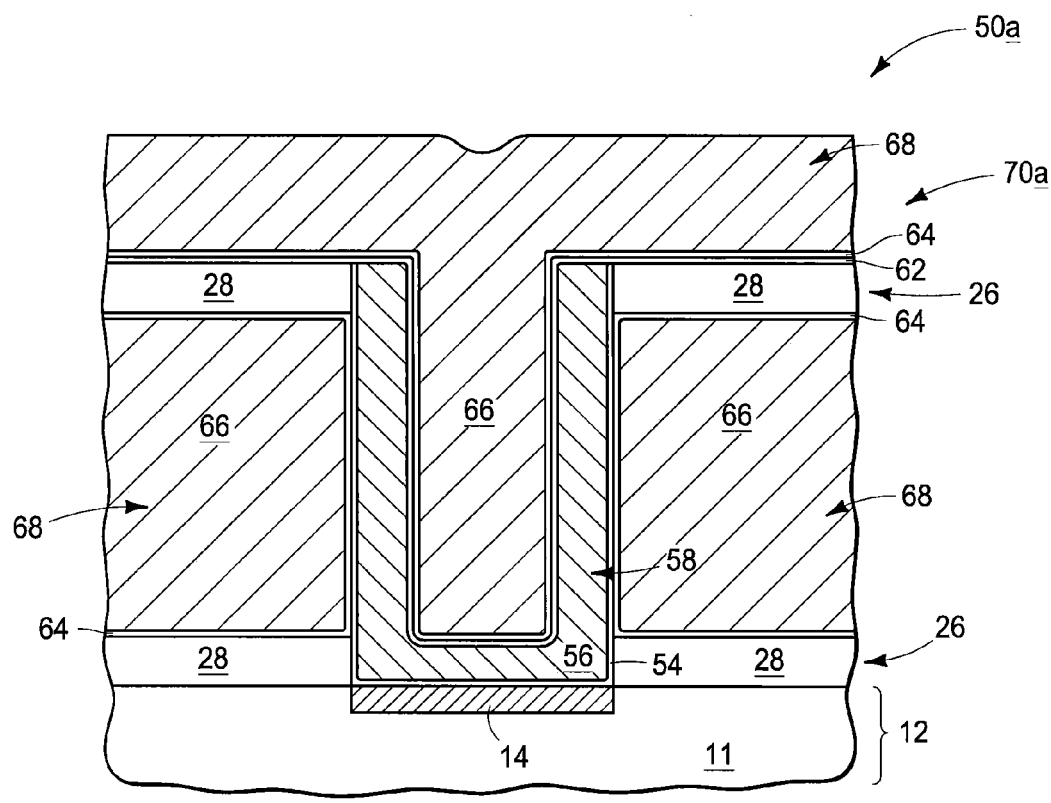

Referring to FIG. 12, construction 50a is illustrated after processing analogous to that described above with reference to FIGS. 9 and 10 is utilized to form a capacitor 70a analogous to the capacitor 70 of FIG. 10.

Figure 13:
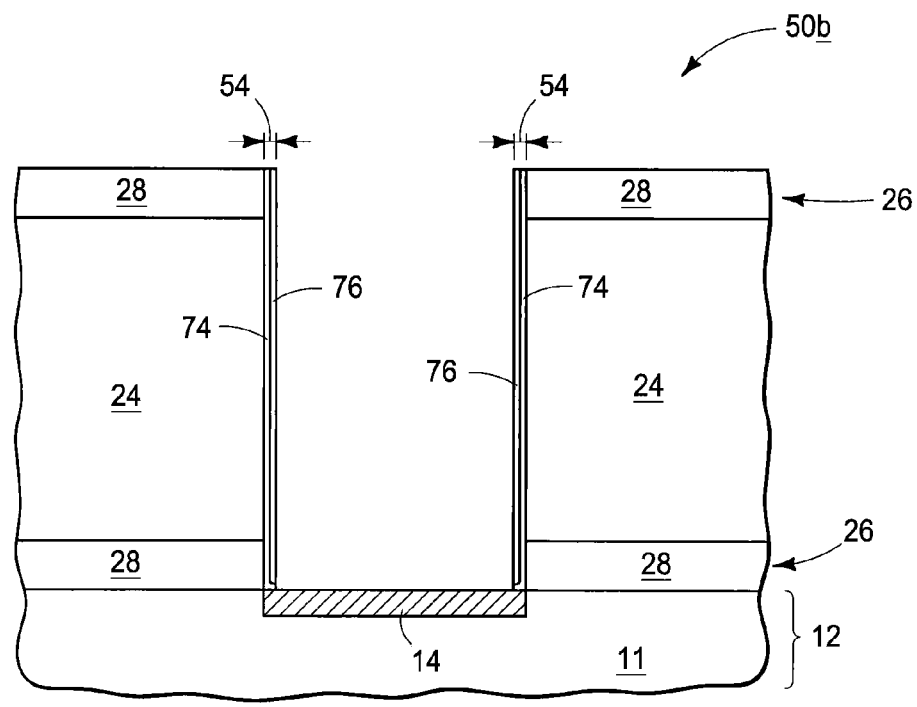
FIGS. 13-17 are diagrammatic cross-sectional views of a portion of a semiconductor construction shown at various process stages of an example embodiment method of forming a capacitor construction. The process stage of FIG. 13 may follow that of FIG. 5 in some embodiments.

As discussed above with reference to FIG. 5, the protective material 54 may comprise two or more discrete compositions in some embodiments. FIG. 13 shows a construction 50b at a processing stage analogous to that of FIG. 6, except that the protective material 54 comprises two portions 74 and 76 which are of different compositions relative to one another.

Although the embodiment of FIG. 13 shows that the protective material comprises two portions, in other embodiments the protective material may comprise more than two portions. In some embodiments, the portions 74 and 76 may be considered to be laminate sheets along the capacitor storage node 58.

The portions 74 and 76 may be referred to as a first portion and a second portion, and in the shown embodiment the first portion is directly against the silicon-containing mass 24. In some embodiments, some of the silicon-containing mass 24 is initially removed with first etching conditions to which the portion 74 is resistant. Then the remainder of the silicon-containing mass is removed with second etching conditions which also remove portion 74, but to which the portion 76 is resistant. For instance, the first portion 74 may comprise one or both of ruthenium and titanium nitride; and the second portion 76 may comprise aluminum nitride. The first etching conditions may comprise a wet etch which would remove the aluminum nitride portion 76 if such were not protected by the portion 74. The second etching conditions may comprise a vapor etch which removes the portion 74, but which stops at portion 76. This embodiment is further explained with reference to FIGS. 14-17.

Figure 14:
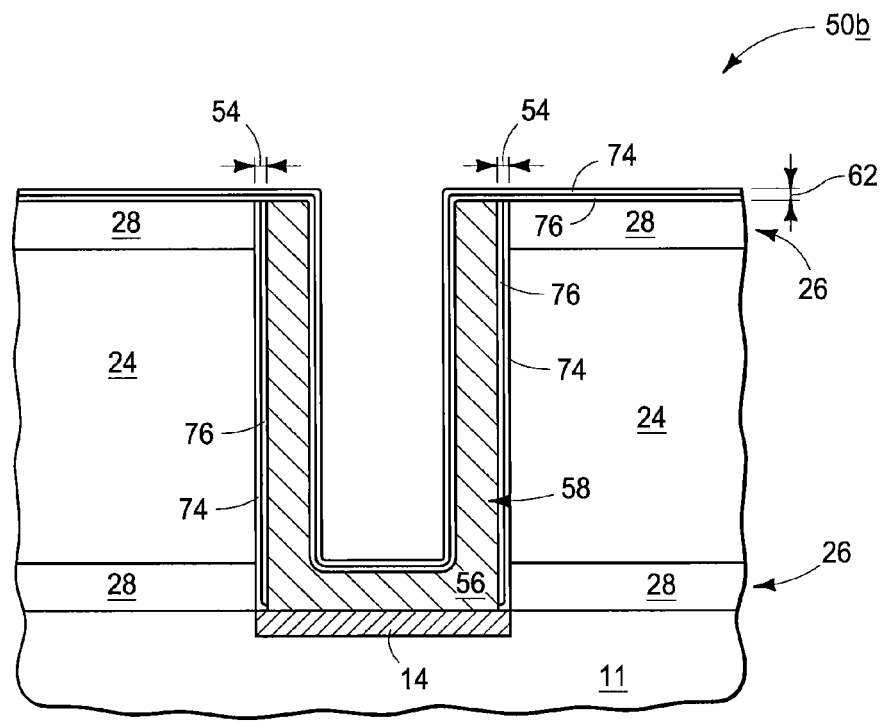

Referring to FIG. 14, construction 50b is shown at a processing stage analogous to that of FIG. 8. The capacitor electrode material 56 has been formed and patterned into the capacitor storage node 58, and the second protective material 62 has been formed across an upper surface of construction 50b. In the shown embodiment, the second protective material 62 comprises the same portions 74 and 76 as the first protective material 54. In other embodiments, the second protective material 62 may have a different configuration than the first protective material.

Figure 15:
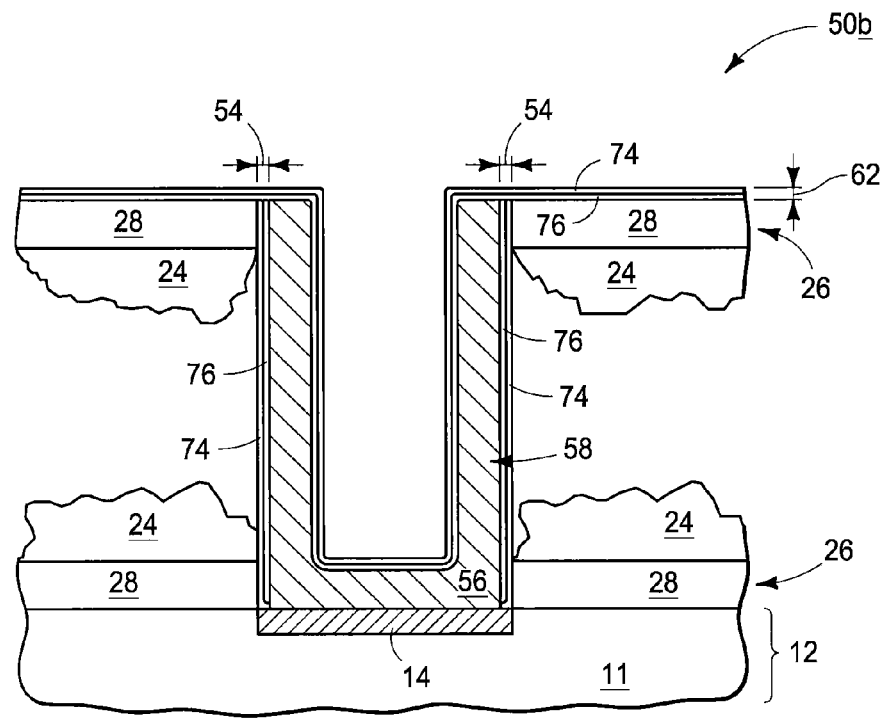

Referring to FIG. 15, some of the silicon-containing mass 24 is removed with a first etch. In some embodiments, the first etch may be a wet etch and the first portion 74 may comprise one or both of titanium nitride and ruthenium and thereby be resistant to such wet etch. In such embodiments, the first portion 74 may have a same composition as the first capacitor electrode material 56.

Figure 16:
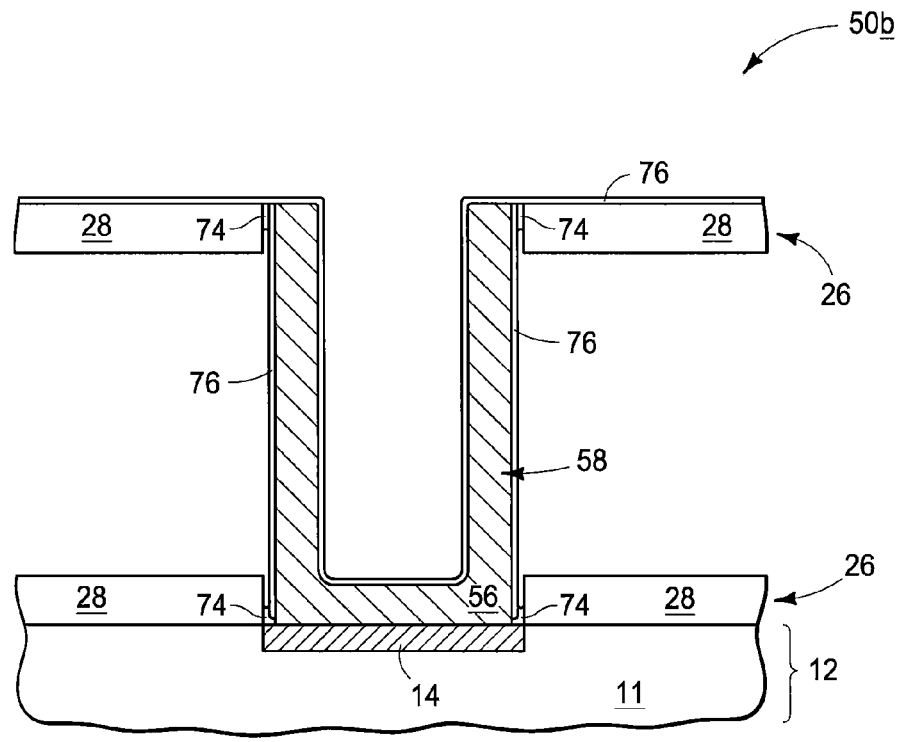

Referring to FIG. 16, a remainder of silicon-containing mass 24 (FIG. 15) is removed with an etch. Such etch also removes first portion 74. In the shown embodiment, the etch recesses first portion 74 adjacent lattice material 28. The etch may be a vapor etch utilizing one or more of $F_2$, $NH_3$ and $NF_3$; and the second portion 76 may comprise one or more of aluminum nitride, molybdenum nitride, niobium nitride, niobium oxide, silicon dioxide, tantalum nitride and tantalum oxide.

Figure 17:
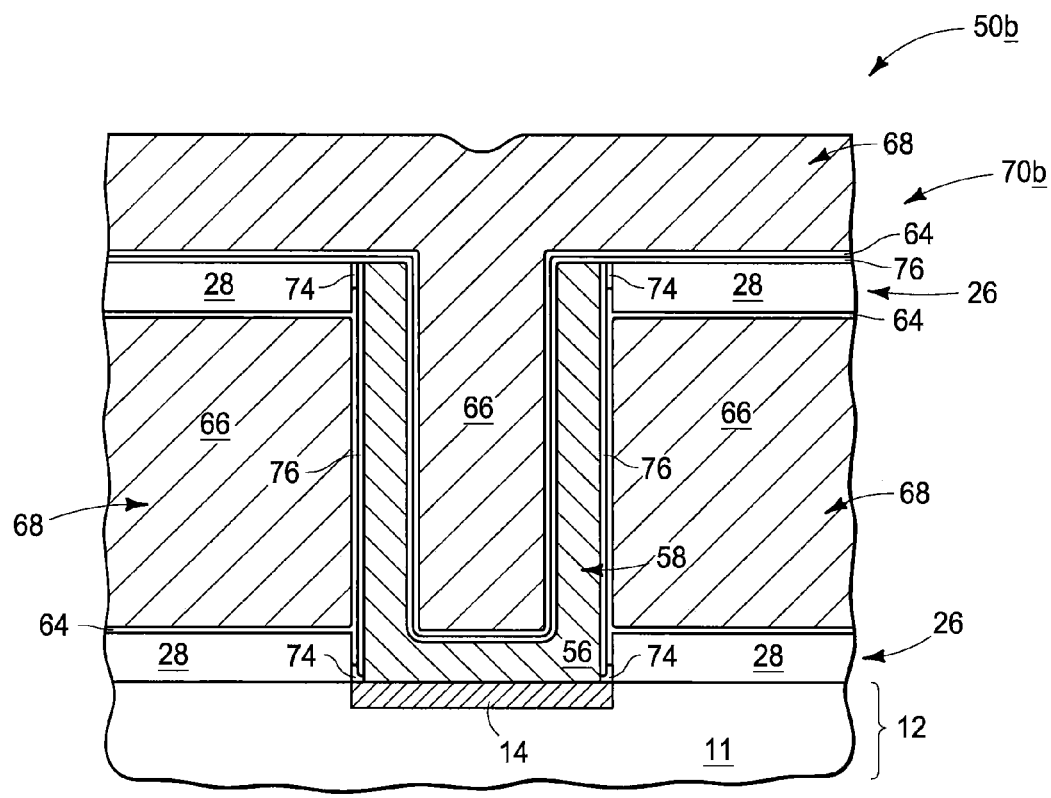

Referring to FIG. 17, construction 50b is illustrated after processing analogous to that described above with reference to FIG. 10 is utilized to form a capacitor 70b analogous to the capacitor 70 of FIG. 10.

The embodiment of FIG. 17 may be distinguished from prior art capacitors in that the embodiment of FIG. 17 comprises portion 76 of the protective material between the capacitor storage node 58 and the plate electrode 66. The embodiment of FIG. 17 may be further distinguished from prior art capacitors in that such embodiment comprises both of the portions 74 and 76 of the protective material between the lattice material 28 and the capacitor storage node 58. In some embodiments, the configuration of FIG. 17 may be considered to comprise a first material corresponding to portion 76 which is directly against the capacitor storage node 58, and which is between the storage node and the capacitor plate electrode 68. The configuration may be further considered to comprise at least one other material between the lattice material 28 and the capacitor storage node 58 besides the first material 76, and in the shown embodiment such other material corresponds to the portion 74.

FIGS. 13-17 describe utilization of a multi-composition protective material in a punch-through application of analogous to that of FIGS. 5-10. In other embodiments, analogous multi-composition protective material may be utilized in non-punch-through applications analogous to that described above with reference to FIGS. 11 and 12.

In some embodiments, protective material 54 may be formed by oxidizing silicon-containing mass 24, as described with reference to FIGS. 18-21.

Figure 18:
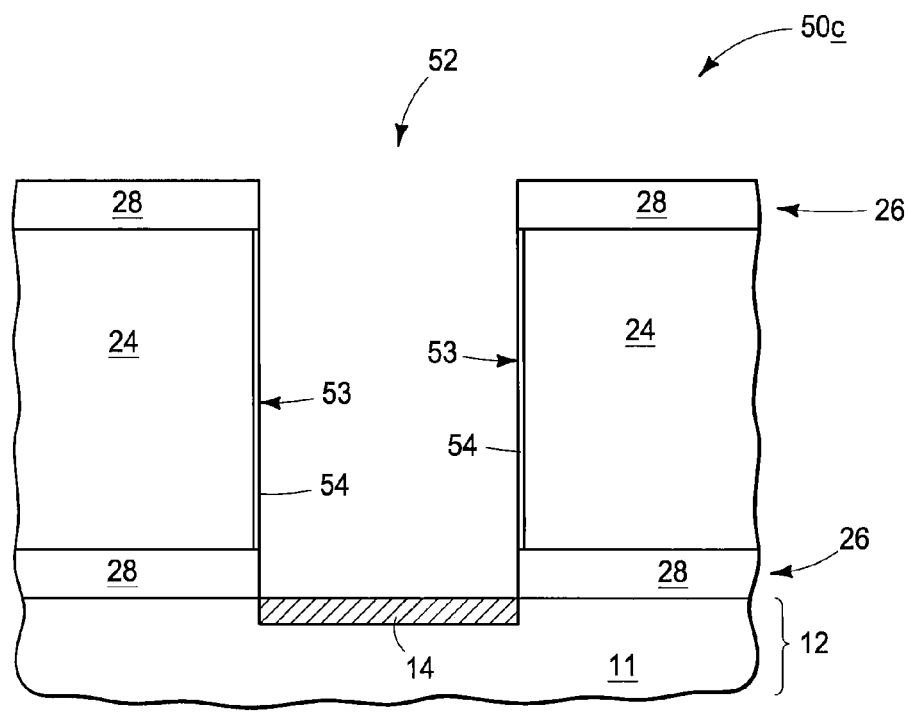
FIGS. 18-21 are diagrammatic cross-sectional views of a portion of a semiconductor construction shown at various process stages of an example embodiment method of forming a capacitor construction. The process stage of FIG. 18 may follow that of FIG. 4 in some embodiments.

Referring to FIG. 18, a construction 50c is shown at a processing stage following that of FIG. 4. Specifically, regions of silicon-containing mass 24 exposed along sidewall peripheries 53 of opening 52 are oxidized to form protective material 54. The protective material may be a thin layer of silicon dioxide in some embodiments, and may, for example, have a thickness within a range of from about a single monolayer to less than or equal to about 1.5 nanometers.

Figure 19:
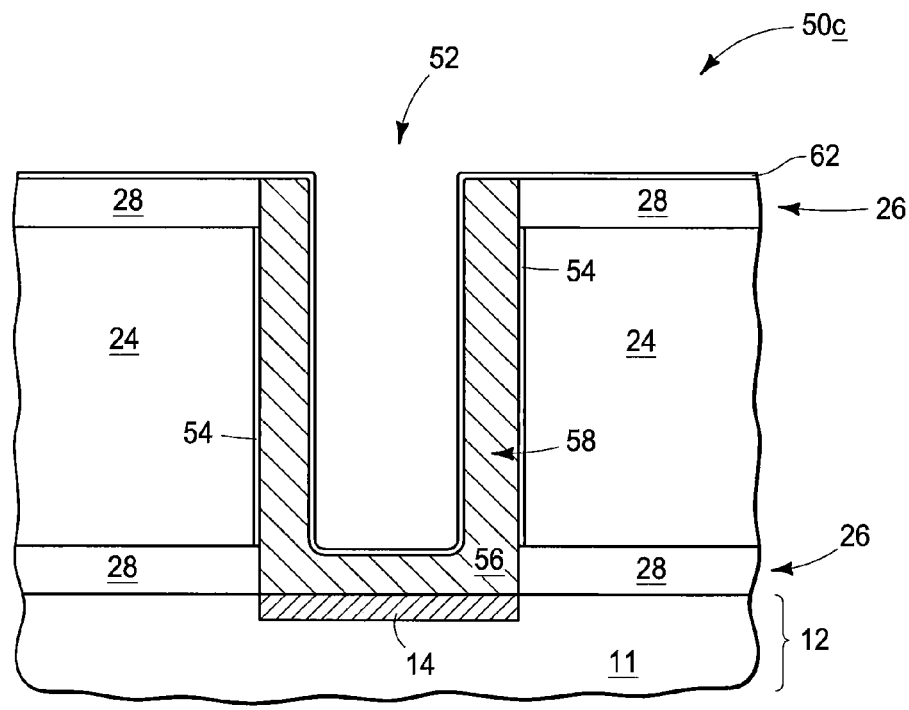

Referring to FIG. 19, construction 50c is shown at a processing stage analogous to that of FIG. 8, and accordingly the capacitor electrode 58 and second protective material 62 have been formed within opening 52.

Figure 20:
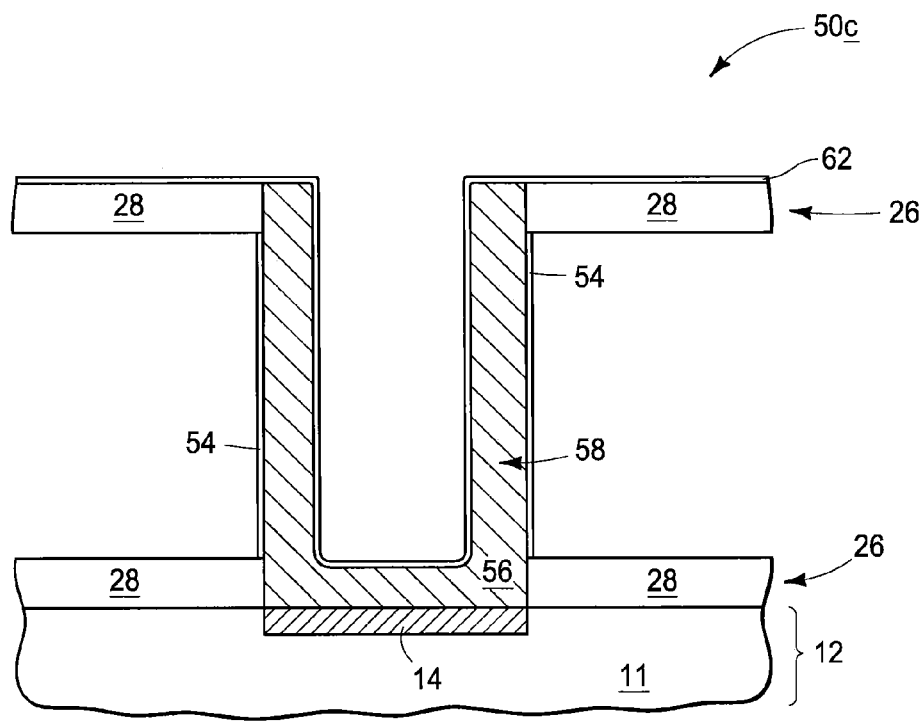

Referring to FIG. 20, silicon-containing mass 24 (FIG. 19) is removed with an etch. Such etch may be a vapor etch and may be highly selective for the silicon-containing mass relative to the silicon dioxide protective material 54. In some embodiments, the etch may have a selectivity for the silicon-containing mass relative to the silicon dioxide protective material 54 of about 100 percent.

Figure 21:
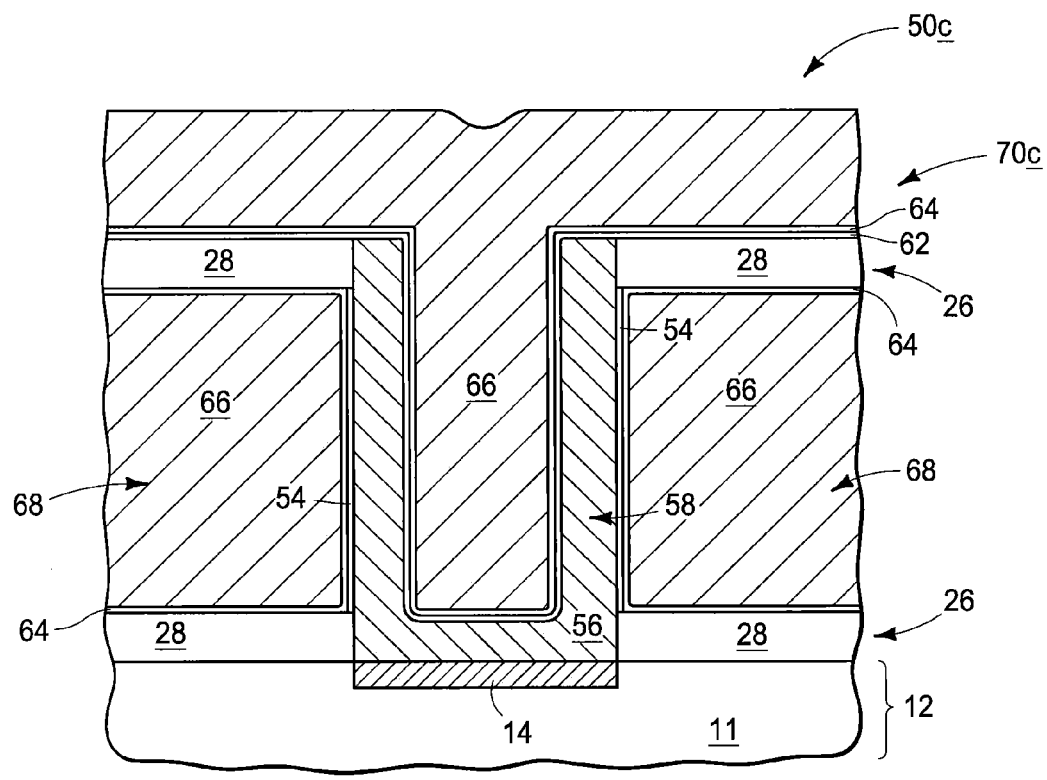

Referring to FIG. 21, construction 50c is illustrated after processing analogous to that described above with reference to FIG. 10 is utilized to form a capacitor 70c analogous to the capacitor 70 of FIG. 10.

Figure 22:
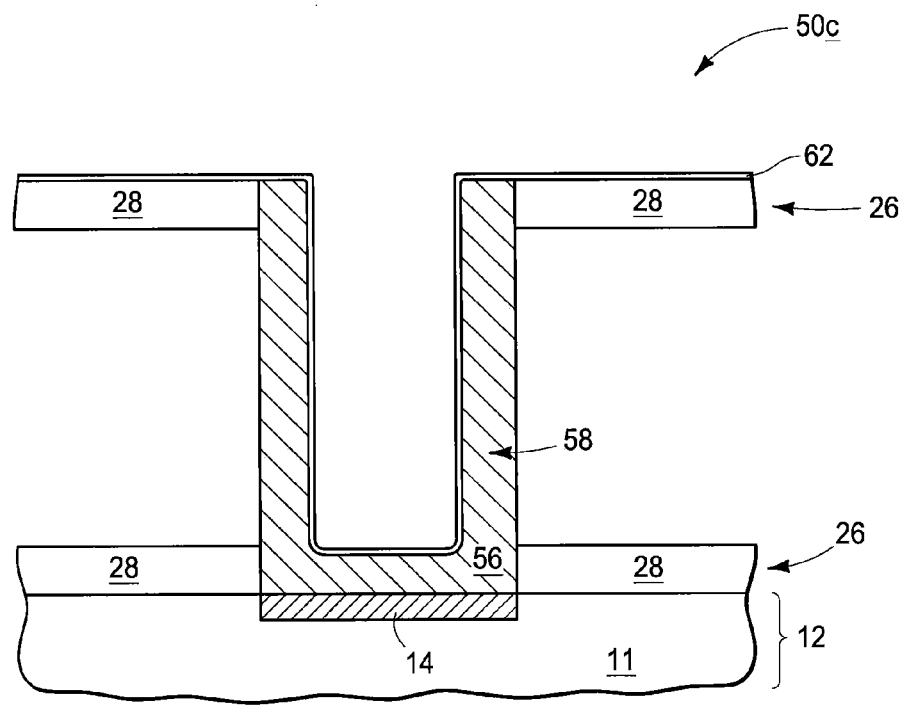
FIGS. 22 and 23 are diagrammatic cross-sectional views of a portion of a semiconductor construction shown at various process stages of an example embodiment method of forming a capacitor construction. The process stage of FIG. 22 may follow that of FIG. 20 in some embodiments.
Figure 23:
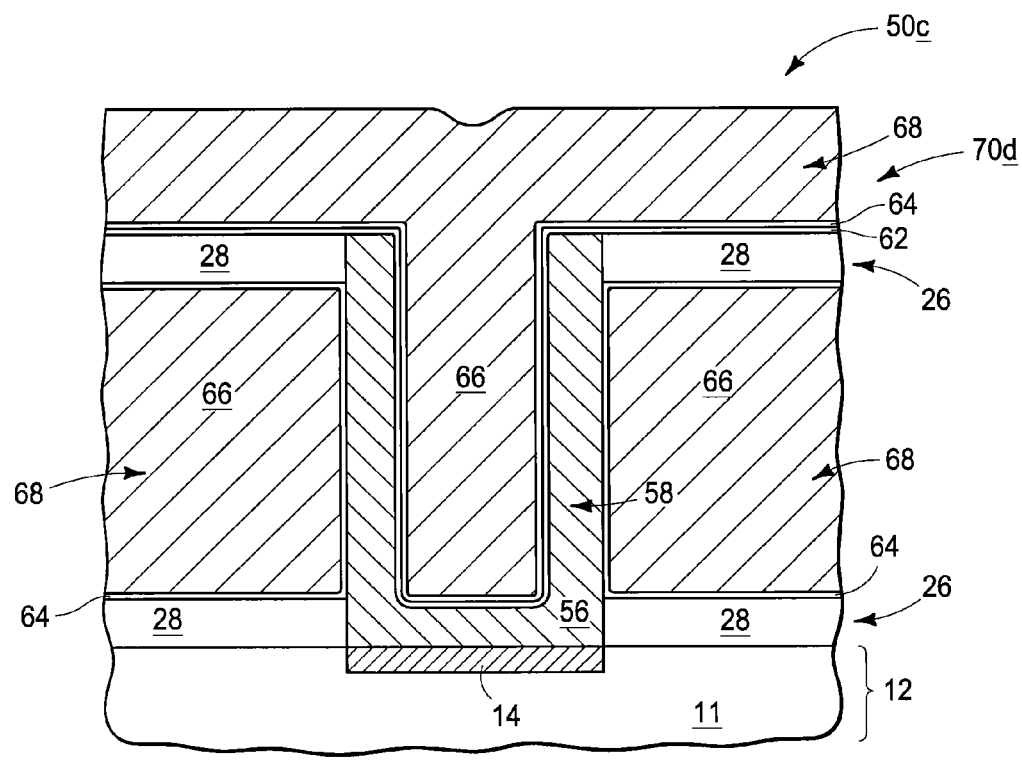

Although the embodiment of FIGS. 20 and 21 shows protective material 54 incorporated into the capacitor 70c, in other embodiments the protective material 54 may be removed instead of being incorporated into the capacitor. FIGS. 22 and 23 illustrate an example of such other embodiments.

Referring to FIG. 22, construction 50c is shown at a process stage subsequent to that of FIG. 20, and after protective material 54 (FIG. 20) is removed. Such removal can be accomplished with any suitable silicon dioxide etch. In the shown embodiment, protective material 62 comprises a different composition than material 54 and has not been removed with the conditions utilized to remove material 54. In other embodiments, material 62 may be removed with the conditions utilized to remove material 54.

Referring to FIG. 23, construction 50c is illustrated after processing analogous to that described above with reference to FIG. 10 is utilized to form a capacitor 70d analogous to the capacitor 70 of FIG. 10.

Although the embodiments of FIGS. 4-23 pertain to methods of fabricating capacitors, similar methodology may be utilized to form other integrated circuit components. In some embodiments, the invention includes multi-material structures, such as the example structure 80 illustrated in FIG. 24. Structure 80 comprises a core material 82 which may comprise, consist essentially of, or consist of one or both of ruthenium and titanium nitride. A first material 84 is along and directly against the core material, with such first material comprising one or more compositions which may be selected from the group consisting of aluminum nitride, niobium oxide, niobium nitride and molybdenum nitride. A second material 86 is on an opposing side of the first material from the core material, and comprises a different composition from the second material. In some embodiments, the second material may comprise a dielectric material. In other embodiments, the second material may comprise electrically conductive material or semiconductive material. In some embodiments, the first material 84 may comprise a thickness within a range of from about one monolayer to about 1.5 nanometers. In some embodiments, the first material 84 may be considered to be a laminate sheet provided along the core material. Although one laminate sheet is shown, in other embodiments there may be multiple laminate sheets. In some embodiments, all of such multiple laminate sheets may comprise one or more compositions selected from the group consisting of aluminum nitride, niobium oxide, niobium nitride and molybdenum nitride.

Figure 24:
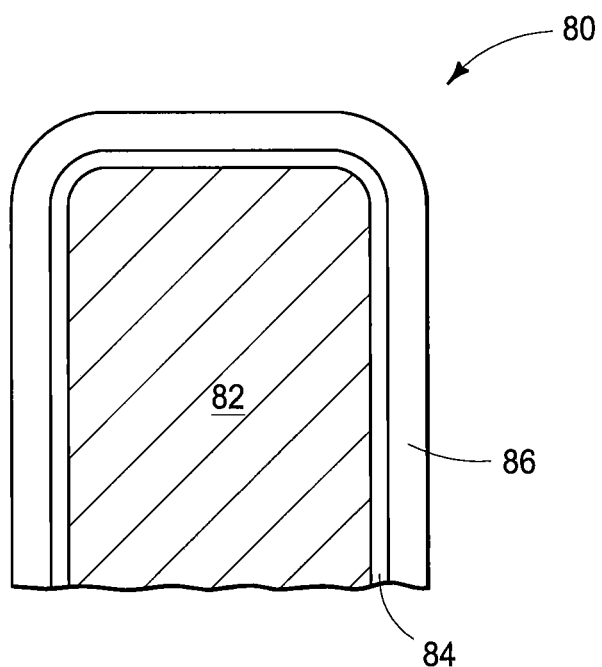
FIG. 24 is a diagrammatic cross-sectional view of a portion of a construction illustrating an example embodiment multi-material structure that may be formed in some embodiments.

The structure of FIG. 24 may be generic to some configurations of the example capacitor constructions described above. For instance, in some embodiments the core material 82 may be considered to correspond to a capacitor electrode material (for instance, the electrode material 56 of FIG. 10), and the first material 84 may be considered to correspond to protective material (for instance, the protective material 54 of FIG. 10). In such embodiments, the second material 86 may correspond to dielectric material (for instance, dielectric material 64 of FIG. 10), or to capacitor plate material (for instance, the capacitor plate material 66 of FIG. 10) which is spaced from the first material by one or more dielectric materials of the capacitor dielectric.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a capacitor. An opening is formed to extend through a silicon-containing mass to a base. Sidewalls of the opening are lined with protective material. A first capacitor electrode material is formed within the lined opening. The first capacitor electrode material is configured as a first capacitor electrode having sidewalls along the protective material at the sidewalls of the opening. At least some of the silicon-containing mass is removed with an etch. The protective material protects the first capacitor electrode material from being removed by the etch. After the silicon-containing mass is removed, a second capacitor electrode material is formed along the sidewalls of the first capacitor electrode. The second capacitor electrode material is configured as a second capacitor electrode and is spaced from the first capacitor electrode by capacitor dielectric.

Some embodiments include a multi-material structure. The structure has a core material consisting essentially of ruthenium or titanium nitride, and has a first material along the core material. The first material comprises a composition selected from the group consisting of aluminum nitride, niobium oxide, niobium nitride and molybdenum nitride. The structure also has a second material on a side of the first material opposite the core material and comprising a composition different from the first material.

Some embodiments include a semiconductor construction. The construction includes a first capacitor electrode over a conductive node supported by a semiconductor base. The first capacitor electrode has sidewalls. A first material is along the sidewalls of the first capacitor electrode and directly against the first capacitor electrode. The first material comprises a composition selected from the group consisting of aluminum nitride, niobium oxide, niobium nitride and molybdenum nitride. A capacitor dielectric is along the sidewalls and directly against the first material. A second capacitor electrode is directly against the capacitor dielectric.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
    a first capacitor electrode over a conductive node supported by a semiconductor base; the first capacitor electrode having sidewalls;
    a first material along the sidewalls of the first capacitor electrode and directly against the first capacitor electrode; the first material comprising a composition selected from the group consisting of niobium nitride and molybdenum nitride;
    a capacitor dielectric along the sidewalls and directly against the first material; and
    a second capacitor electrode directly against the capacitor dielectric.

2. A semiconductor construction, comprising:
    a first capacitor electrode over a conductive node supported by a semiconductor base; the first capacitor electrode having sidewalls;
    a first material along the sidewalls of the first capacitor electrode and directly against the first capacitor electrode; the first material comprising a composition selected from the group consisting of aluminum nitride, niobium oxide, niobium nitride and molybdenum nitride;
    a capacitor dielectric along the sidewalls and directly against the first material;
    a second capacitor electrode directly against the capacitor dielectric; and wherein the first material is between the node and the first capacitor electrode.

3. The construction of claim 1 wherein the first capacitor electrode consists essentially of ruthenium or titanium nitride.

4. The construction of claim 1 wherein the second capacitor electrode comprises a same composition as the first capacitor electrode.

5. The construction of claim 1 wherein the first material has a thickness within a range of from about 1 monolayer to about 1.5 nanometers.

6. A semiconductor construction, comprising:
a first capacitor electrode over a conductive node supported by a semiconductor base; the first capacitor electrode having sidewalls;
a first material along the sidewalls of the first capacitor electrode and directly against the first capacitor electrode; the first material comprising a composition selected from the group consisting of aluminum nitride, niobium oxide, niobium nitride and molybdenum nitride;
a capacitor dielectric along the sidewalls and directly against the first material;
a second capacitor electrode directly against the capacitor dielectric; and
wherein the first capacitor electrode is container-shaped; wherein the capacitor dielectric and second capacitor electrode extend into the container shape of the container-shaped first electrode; and further comprising a second material within the container-shape between the capacitor dielectric and the first capacitor electrode.

7. The construction of claim 6 wherein the first and second materials are a same composition as one another.

8. The construction of claim 6 wherein the first and second materials comprise different compositions from one another.

9. A semiconductor construction, comprising:
a first capacitor electrode over a conductive node supported by a semiconductor base; the first capacitor electrode having sidewalls;
a first material along the sidewalls of the first capacitor electrode and directly against the first capacitor electrode; the first material comprising a composition selected from the group consisting of aluminum nitride, niobium oxide, niobium nitride and molybdenum nitride;
a capacitor dielectric along the sidewalls and directly against the first material;
a second capacitor electrode directly against the capacitor dielectric; and
a lattice structure along portions of the sidewalls of the first capacitor storage node; and wherein lattice structure is spaced from the first capacitor storage node by at least the first material.

10. The construction of claim 9 wherein the lattice structure is spaced from the first capacitor storage node by only the first material.

11. The construction of claim 9 wherein the lattice structure is spaced from the first capacitor storage node by at least one other material in addition to the first material.

12. The construction of claim 11 wherein the first material comprises aluminum nitride, and wherein said at least one other material comprises titanium nitride.

13. The construction of claim 12 wherein the first capacitor electrode consists essentially of titanium nitride.

14. The construction of claim 9 wherein the lattice structure comprises silicon nitride.

15. A semiconductor construction, comprising:
a first capacitor electrode having sidewalls; the first capacitor electrode being container-shaped;
a first material along the sidewalls of the first capacitor electrode and directly against the first capacitor electrode; the first material comprising a composition selected from the group consisting of aluminum nitride, niobium oxide, niobium nitride and molybdenum nitride;
a capacitor dielectric along the sidewalls and directly against the first material, and a second capacitor electrode directly against the capacitor dielectric; wherein the capacitor dielectric and second capacitor electrode extend into the container shape of the container-shaped first electrode; and
a second material within the container-shape between the capacitor dielectric and the first capacitor electrode; the second material comprising a composition selected from the group consisting of aluminum nitride, niobium oxide, niobium nitride and molybdenum nitride.

* * * * *